US012750037B2

(12) United States Patent
Toivanen

(10) Patent No.: US 12,750,037 B2
(45) Date of Patent: Sep. 29, 2026

(54) FILTER WITH MULTIPLE OUTPUTS OR INPUTS TO IMPLEMENT MULTIPLE FILTER FREQUENCY RESPONSES

(71) Applicant: RF360 Singapore Pte. Ltd., Singapore (SG)

(72) Inventor: Lasse Jalmari Toivanen, Espoo (FI)

(73) Assignee: RF360 Singapore Pte. Ltd., Singapore (SG)

( * ) Notice: Subject to any disclaimer, the term of this patent is extended or adjusted under 35 U.S.C. 154(b) by 160 days.

(21) Appl. No.: 18/588,166

(22) Filed: Feb. 27, 2024

(65) Prior Publication Data

US 2024/0283430 A1 Aug. 22, 2024

(51) Int. Cl.
*H03H 9/64* (2006.01)
*H03H 9/70* (2006.01)

(52) U.S. Cl.
CPC .......... *H03H 9/6406* (2013.01); *H03H 9/703* (2013.01)

(58) Field of Classification Search
CPC .. H03H 9/46; H03H 9/54; H03H 9/64; H03H 9/70; H03H 9/72
See application file for complete search history.

(56) References Cited

U.S. PATENT DOCUMENTS 7,583,936 B2 * 9/2009 Kovacs .................... H04B 1/18 455/199.1
8,701,065 B1 4/2014 Silver et al.
9,369,109 B2 6/2016 Hirota et al.
9,484,887 B2 * 11/2016 Jian ...................... H03H 9/6409
9,825,611 B2 11/2017 Hey-Shipton
10,193,530 B2 1/2019 Takamine
10,277,198 B2 4/2019 Lear
10,541,713 B2 1/2020 Ni et al.
10,547,288 B2 * 1/2020 Takeuchi ............. H04B 1/0057
10,659,086 B2 5/2020 Khlat
10,840,887 B2 * 11/2020 Schmalzl ............... H03H 9/547
(Continued)

FOREIGN PATENT DOCUMENTS

CN 103918180 A 7/2014
CN 109921808 A 6/2019
(Continued)

OTHER PUBLICATIONS

International Search Report and Written Opinion—PCT/EP2021/079833—ISA/EPO—Feb. 10, 2022.

*Primary Examiner* — Andrea Lindgren Baltzell
*Assistant Examiner* — Alan Wong
(74) *Attorney, Agent, or Firm* — Loza & Loza LLP

(57) ABSTRACT

A filter is provided that includes a set of cascaded resonator stages coupled between a filter input and a first filter output, wherein the filter includes a second filter output coupled to an output of a first or an intermediate one of the set of cascaded resonator stages. Another filter includes a set of cascaded resonator stages coupled between a first filter input and a filter output, wherein the filter includes a second filter input coupled to an input of an intermediate or a last one of the set of cascaded resonator stages. Both filters are configured to apply a first filter frequency response to a first signal propagating via the set of cascaded resonator stages, and apply a second filter frequency response to a second signal propagating via a subset of one or more of the set of cascaded resonator stages.

20 Claims, 6 Drawing Sheets

(56) References Cited

U.S. PATENT DOCUMENTS

| | | | | |
|---|---|---|---|---|
| 11,381,218 | B2 | 7/2022 | Yamaguchi et al. | |
| 11,558,073 | B2 | 1/2023 | Yamada | |
| 11,942,924 | B2 * | 3/2024 | Toivanen | H03H 9/725 |
| 12,068,738 | B2 * | 8/2024 | Schmidhammer | H03H 9/542 |
| 2003/0210108 | A1 | 11/2003 | Karlquist | |
| 2018/0343000 | A1 | 11/2018 | Nosaka | |
| 2019/0173448 | A1 | 6/2019 | Kato et al. | |
| 2020/0366325 | A1 | 11/2020 | Medra et al. | |
| 2022/0166410 | A1 | 5/2022 | Toivanen | |

FOREIGN PATENT DOCUMENTS

| | | | |
|---|---|---|---|
| DE | 102006044663 | A1 | 4/2008 |
| WO | 2020008759 | A1 | 1/2020 |

* cited by examiner

FILTER WITH MULTIPLE OUTPUTS OR INPUTS TO IMPLEMENT MULTIPLE FILTER FREQUENCY RESPONSES

CROSS REFERENCE TO RELATED APPLICATION

The present Application for Patent is a Continuation of U.S. patent application Ser. No. 17/101,857, entitled "FILTER WITH MULTIPLE OUTPUTS OR INPUTS TO IMPLEMENT MULTIPLE FILTER FREQUENCY RESPONSES" and filed on Nov. 23, 2020, which is expressly incorporated by reference herein in its entirety.

FIELD

Aspects of the present disclosure relate generally to filters, and in particular, to a filter with multiple-inputs-single-output or single-input-multiple-outputs to implement multiple filter frequency responses.

BACKGROUND

A wireless communication device includes a receiver front-end capable of receiving signals in a plurality of selectable frequency bands. The selected frequency band may be a single frequency band. Alternatively, a subset of two or more frequency bands may be selected, such as in the case, when the wireless communication device is receiving signals in accordance with a carrier aggregation (CA) mode. Band select filters are typically employed in a receiver front-end to pass through signals within the frequency bands, and reject signals outside of the frequency bands, respectively.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus. The apparatus includes a filter including: a first set of one or more cascaded resonator stages coupled between a filter input and a first filter output, each cascaded resonator stage of the first set comprising a first series micro-acoustic resonator and a first parallel micro-acoustic resonator; and a second set of one or more cascaded resonator stages coupled between the first filter output and a second filter output, each cascaded resonator stage of the second set comprising a second series micro-acoustic resonator and a second parallel micro-acoustic resonator.

Another aspect of the disclosure relates to a method. The method includes receiving first and second signals at a filter input; filtering the first signal via a set of cascaded resonator stages to generate a first filtered signal at a first filter output; and filtering the second signal via a subset of one or more of the set of cascaded resonator stages to generate a second filtered signal at a second filter output.

Another aspect of the disclosure relates to an apparatus. The apparatus includes a filter including a first set of one or more cascaded resonator stages coupled between a first filter input and a second filter input, each cascaded resonator stage of the first set comprising a first series micro-acoustic resonator and a first parallel micro-acoustic resonator; and a second set of one or more cascaded resonator stages coupled between the second filter input and a filter output, each cascaded resonator stage of the second set comprising a second series micro-acoustic resonator and a second parallel micro-acoustic resonator.

Another aspect of the disclosure relates to an apparatus. The apparatus includes a filter including a set of cascaded resonator stages coupled between a filter input and a first filter output, wherein the filter includes a second filter output coupled to an output of a first or an intermediate one of the set of cascaded resonator stages.

Another aspect of the disclosure relates to a method. The method includes receiving first and second signals at first and second filter inputs, respectively; filtering the first signal via a set of cascaded resonator stages to generate a first filtered signal at a filter output; and filtering the second signal via a subset of one or more of the set of cascaded resonator stages to generate a second filtered signal at the filter output.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Cellular communication systems use various governmental-licensed frequency bands or carriers to transmit downlink (DL) data to wireless communication devices, such as smart phones, desktop computers, laptop computers, Internet of Things (IoT), and other devices. Depending on the governmental agency that assigns frequency bands or carriers for transmission of data to wireless communication devices, some of these bands, that are exemplified herein, are referred to as B25, B66, B34, and B39. However, it shall be understood that the filtering concepts described herein are applicable to other frequency bands.

Frequency band B25 extends from 1930 to 1995 megahertz (MHz). Frequency band B66 extends from 2110 to 2200 MHz. Frequency band B34 extends from 2010 to 2025 MHz. And, frequency band B39 extends from 1880 to 1920 MHz. A wireless communication device, capable of receiving DL signals transmitted via these frequency bands, includes a receiver with appropriate bandpass filters (BPFs) for substantially passing through these DL signals in these frequency bands, while substantially rejecting signals outside of the frequency bands, respectively. This is better explained with reference to an example receiver front-end described further herein.

Figure 1A:
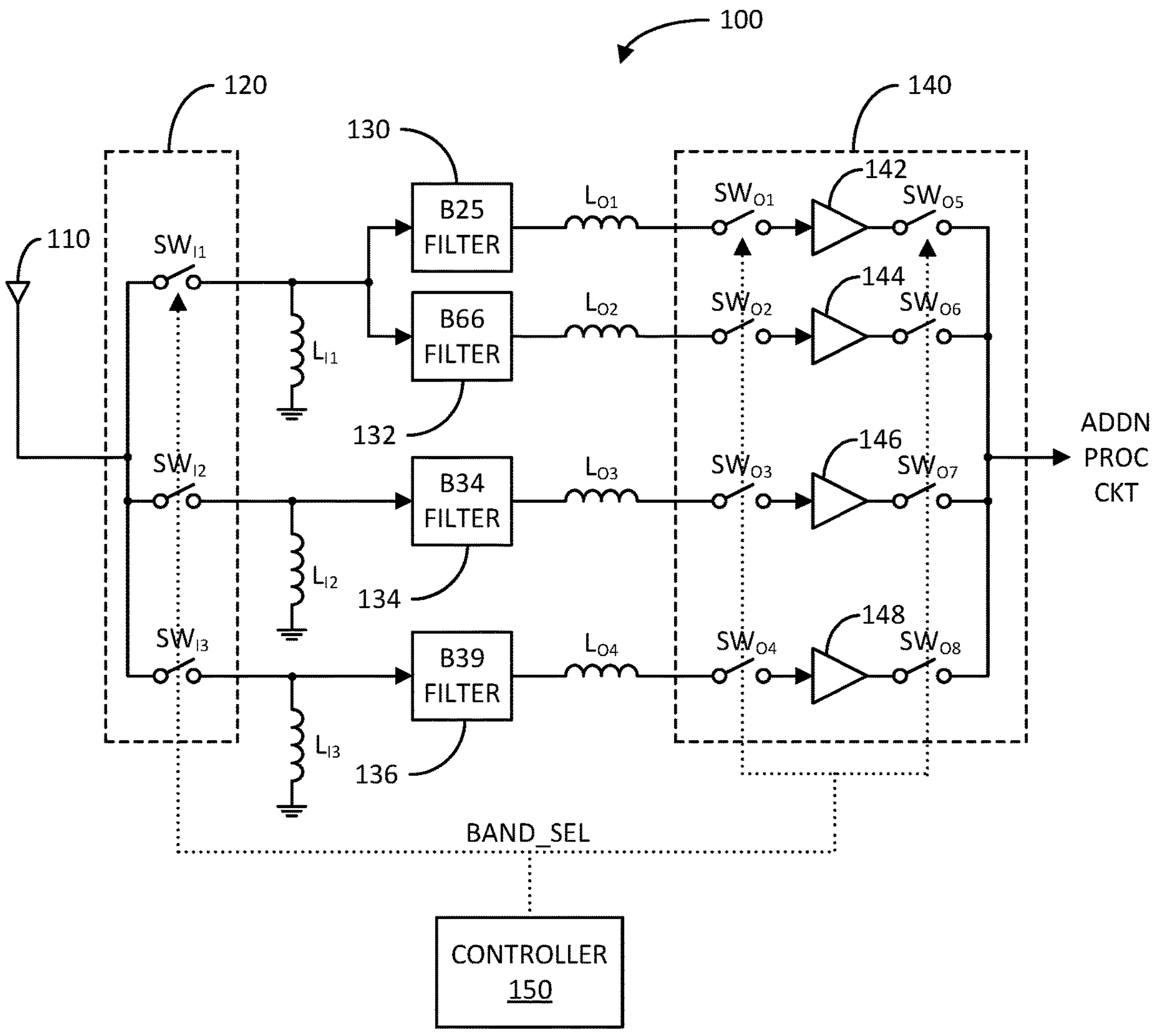
FIG. 1A illustrates a schematic/block diagram of an example receiver front-end in accordance with an aspect of the disclosure.

FIG. 1A illustrates a schematic/block diagram of an example receiver front-end 100 in accordance with an aspect of the disclosure. The receiver front-end 100 includes at least one antenna 110, an antenna switching network 120, a set of shunt inductors LI1, LI2, and LI3, a set of band select filters 130, 132, 134, and 136, a set of series inductors LO1, LO2, LO3, and LO4, a low noise amplifier (LNA) switching network 140, and a controller 150.

The antenna switching network 120 includes a set of switching devices SWI1, SWI2, and SWI3 including respective first terminals coupled to the at least one antenna 110. The open/closed states of the set of switching devices SWI1, SWI2, and SWI3 are responsive to a band select signal BAND_SEL generated by the controller 150. The BAND_SEL signal may be a single signal, a combination of multiple signals, a mobile industry processor interface (MIPI) protocol signal, etc. The set of switching devices SWI1, SW12, and SWI3 include respective second terminals coupled to inputs of filters 130/132, 134, and 136, respectively. The set of shunt inductors LI1, LI2, and LI3 are coupled between the inputs of the filters 130/132, 134, and 136 and ground, respectively. The set of shunt inductors LI1, LI2, and LI3, one or more of which may be optional, function to improve the impedance match between the input of the filters 130/132, 134, and 136 and the at least one antenna 110, respectively; as well as provide input phase shifting to reduce loading of one filter by another filter when the filters are used simultaneously (i.e., the inputs of the filters are coupled together).

The set of filters 130, 132, 134, and 136 are configured to substantially pass through the DL signals within corresponding frequency bands, and substantially reject signals that are outside of the corresponding frequency bands. The filter 130 is for the B25 frequency band; the filter 132 is for B66 frequency band; the filter 134 is for B34 frequency band; and the filter 136 is for the B39 frequency band. Each of the filters 130, 132, 134, and 136 may be configured as a micro-acoustic filter (e.g., surface acoustic wave (SAW) filter or bulk acoustic wave (BAW) filter).

The LNA switching network 140 includes a first set of switching devices SWO1, SWO2, SWO3, and SWO4, a set of LNAs 142, 144, 146, and 148, and a second set of switching devices SWO5, SWO6, SWO7, and SWO8. The set of series inductors LO1, LO2, LO3, and LO4, one or more of which may be optional, are coupled between the outputs of the set of filters 130, 132, 134, and 136 and respective first terminals of the first set of switching devices SWO1, SWO2, SWO3, and SWO4. The set of series inductors LO1, LO2, LO3, and LO4 function to improve the impedance match between the outputs of the set of filters 130, 132, 134, and 136 and the inputs of the set of LNAs 142, 144, 146, and 148, respectively.

The set of LNAs 142, 144, 146, and 148 are coupled between respective second terminals of the first set of switching device SWO1, SWO2, SWO3, and SWO4 and respective first terminals of the second set of switching devices SWO5, SWO6, SWO7, and SWO8. The second set of switching devices SWO5, SWO6, SWO7, and SWO8 include respective second terminals coupled together, and to additional processing circuitry further downstream (e.g., mixer with local oscillator (LO), baseband filter, etc.). Similarly, the open/closed states of the first and second sets of switching devices SWO1-SWO4 and SWO5-SWO8 are responsive to the band select signal BAND_SEL generated by the controller 150.

In operation, if the DL signals-of-interest are within frequency bands B25 and B66, which may be multiplexed together, the band select signal BAND_SEL controls the switching devices SWI1, SWO1, SWO2, SWO5, and SWO6 to close, and the switching devices SWI2, SWI3, SWO3, SWO4, SWO7, and SWO8 to open. In this configuration, the at least one antenna 110 is coupled to the inputs of the filters 130 and 132 including the shunt inductor LI1, the outputs of the filters 130 and 132 are coupled to the inputs of the LNAs 142 and 144 via the series inductors LO1 and LO2, and the outputs of the LNAs 142 and 144 are coupled to the additional processing circuitry, respectively.

The filter 130 substantially passes through the DL signal within the B25 frequency band, and substantially rejects signals outside of the B25 frequency band in accordance with a first filter frequency response. Similarly, the filter 132 substantially passes through the DL signal within the B66 frequency band, and substantially rejects signals outside of the B66 frequency band in accordance with a second filter frequency response. Thus, the receiver front-end 100 may process the DL signals within the frequency bands B25 and B66 (e.g., filter and low noise amplify) and provide them to the additional processing circuitry to obtain data embedded in these signals. In this configuration, the remaining filters 134 and 136 and LNAs 146 and 148 are not used because the corresponding switching devices SWI2, SWI3, SWO3, SWO4, SWO7, and SWO8 are open.

Similarly, if the DL signal-of-interest is within frequency band B34, the band select signal BAND_SEL controls the switching devices SWI2, SWO3, and SWO7 to close, and the switching devices SWI1, SWI3, SWO1, SWO2, SWO4, SWO5, SWO6, and SWO8 to open. In this configuration, the at least one antenna 110 is coupled to the input of the filter 134 including the shunt inductor LI2, the output of the filter 134 is coupled to the input of the LNA 146 via the series inductor LO3, and the output of the LNA 146 is coupled to the additional processing circuitry. The filter 134 substantially passes through the DL signal within the B34 frequency band, and substantially rejects signals outside of the B34 frequency band in accordance with a particular filter frequency response. Thus, the receiver front-end 100 may process the DL signal within the frequency band B34 (e.g., filter and low noise amplify) and provide them to the additional processing circuitry to obtain the data embedded in the signal. In this configuration, the remaining filters 130, 132 and 136 and LNAs 142, 144, and 148 are not used because the corresponding switching devices SWI1, SWI3, SWO1, SWO2, SWO4, SWO5, SWO6, and SWO8 are open.

Similarly, if the DL signals-of-interest are within frequency bands B34 and B39 in a carrier aggregation (CA) mode of operation, the band select signal BAND_SEL controls the switching devices SWI2, SWI3, SWO3, SWO4, SWO7, and SWO8 to close, and the switching devices SWI1, SWO1, SWO2, SWO5, and SWO6 to open. In this configuration, the at least one antenna 110 is coupled to the input of the filters 134 and 136 including the shunt inductors LI2 and LI3, the outputs of the filter 134 and 136 are coupled to the inputs of the LNAs 146 and 148 via the series inductors LO3 and LO4, and the outputs of the LNAs 146 and 148 are coupled to the additional processing circuitry.

The filter 134 substantially passes through the DL signal within the B34 frequency band, and substantially rejects signals outside of the B34 frequency band in accordance with a first filter frequency response. Also, the filter 136 substantially passes through the DL signal within the B39 frequency band, and substantially rejects signals outside of the B39 frequency band in accordance with a second filter frequency response. Thus, the receiver front-end 100 may process the DL signals within the frequency bands B34 and B39 (e.g., filter and low noise amplify) in CA mode, and provide them to the additional processing circuitry to obtain the data embedded in the signals. In this configuration, the remaining filters 130 and 132 and LNAs 142 and 144 are not used because the corresponding switching devices SWI1, SWO1, SWO2, SWO5 and SWO6 are open.

Figure 1B:
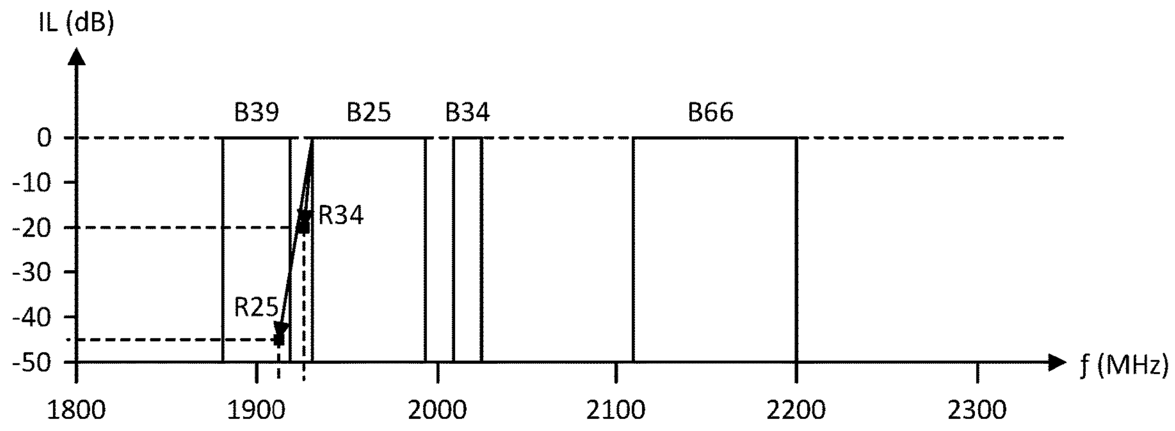
FIG. 1B illustrates a frequency spectrum diagram of example frequency bands of received channels for the receiver front-end of FIG. 1A in accordance with another aspect of the disclosure.

To reduce costs, circuit area, and improve performance (e.g., less signal loss and improved noise figure), it would be desirable to reduce the number of components in the receiver front-end 100. With reference to FIG. 1B, which illustrates frequency spectrum of the frequency bands B39, B25, B34, and B66, it is noted that the frequency band B25 is close to the frequency band B34 (e.g., 15 MHz away). Accordingly, as discussed further herein, the B25 filter 130 may have enough bandwidth to also cover the B34 frequency band. However, the B34 frequency band has a rejection requirement (identified as R34) that is at least −20 decibels (dB) at 1925 MHz, which is 5 MHz below the passband of the frequency band B25. As discussed herein, the filter B25 may be reconfigured to have multiple- or dual-outputs to produce the filter outputs for the frequency bands B25 and B34, respectively. In addition, the reconfigured filter B25 may have a notch near the lower frequency end of the B25 frequency band that can be tuned to provide the required rejection R34 for frequency band R34, without substantially affecting the rejection requirement (identified as R25) for the frequency band R25. The R25 rejection requirement is at least −45 dB rejection at 1915 MHz.

Figure 2A:
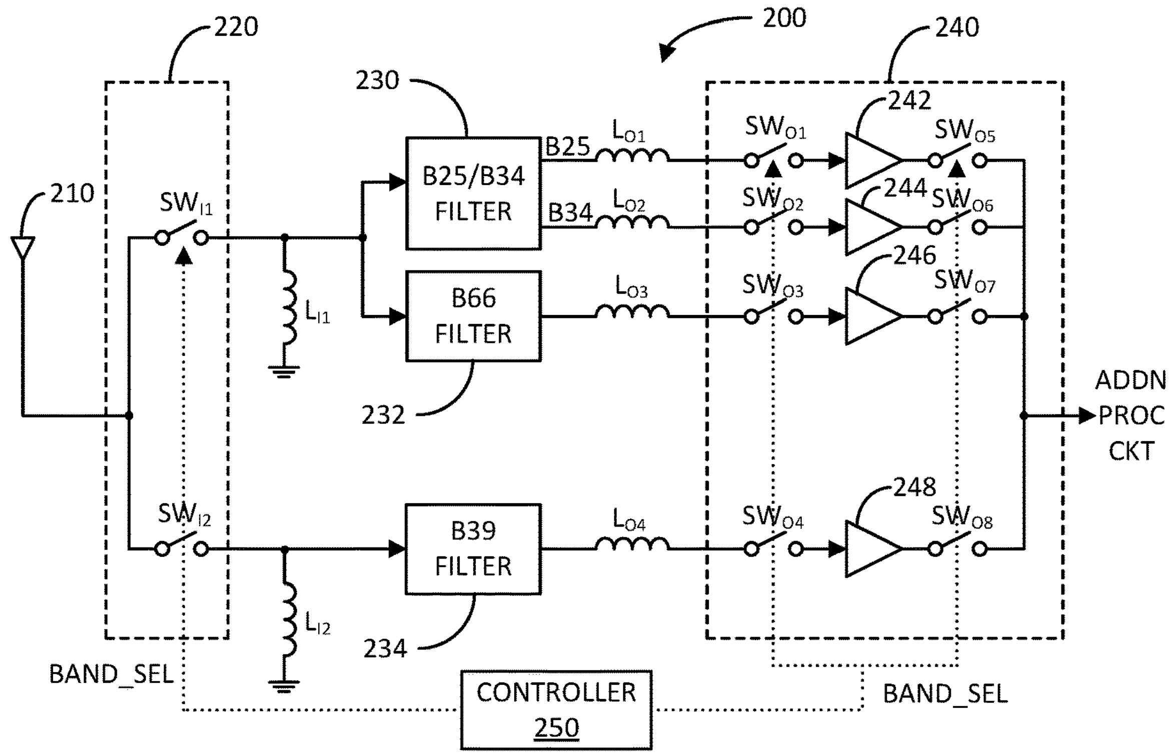
FIG. 2A illustrates a schematic/block diagram of another example receiver front-end in accordance with another aspect of the disclosure.

FIG. 2A illustrates a schematic/block diagram of another example receiver front-end 200 in accordance with another aspect of the disclosure. The receiver front-end 200 includes at least one antenna 210, an antenna switching network 220, a set of shunt inductors LI1 and LI2, a set of band select filters 230, 232, and 234, a set of series inductors LO1, LO2, LO3, and LO4, a low noise amplifier (LNA) switching network 240, and a controller 250. As discussed further herein, the band select filter 230 is configured with a single input, and multiple- or dual-outputs to produce different frequency responses suitable for different frequency bands, such as the B25 and B34 frequency bands, respectively.

The antenna switching network 220 includes a set of switching devices SWI1 and SWI2 including respective first terminals coupled to the at least one antenna 210. The open/closed states of the set of switching devices SWI1 and SWI2 are responsive to a band select signal BAND_SEL generated by the controller 250. Similarly, the BAND_SEL signal may be a single signal, a combination of multiple signals, a mobile industry processor interface (MIPI) protocol signal, etc. The set of switching devices SWI1 and SWI2 include respective second terminals coupled to inputs of filters 230/232 and 234, respectively. The set of shunt inductors LI1 and LI2 are coupled between the inputs of the filters 230/232 and 234 and ground, respectively. The set of shunt inductors LI1 and LI2, one or more of which may be optional, function to improve the impedance match between the input of the filters 230/232 and 234 and the at least one antenna 210, respectively; as well as provide phase shifting to reduce loading of one filter by another filter when the filters are used simultaneously (i.e., when the inputs of the filters are coupled together).

The set of filters 230, 232, and 234 are configured to substantially pass through the DL signals within corresponding frequency bands, and substantially reject signals that are outside of the corresponding frequency bands. As previously discussed, the filter 230 includes dual-outputs to provide two different filter frequency responses suitable for frequency bands B25 and B34; the filter 232 provides a filter frequency response suitable for frequency band B66; and the filter 234 provides a filter frequency response suitable for frequency band B39. Each of the filters 230, 232, and 234 may be configured as a micro-acoustic filter (e.g., surface acoustic wave (SAW) filter or bulk acoustic wave (BAW) filter).

The LNA switching network 240 includes a first set of switching devices SWO1, SWO2, SWO3, and SWO4, a set of LNAs 242, 244, 246, and 248, and a second set of switching devices SWO5, SWO6, SWO7, and SWO8. The set of series inductors LO1, LO2, LO3, and LO4 are coupled between the dual-outputs of filter 230 and the outputs of filters 232 and 234, and first terminals of the first set of switching devices SWO1, SWO2, SWO3, and SWO4, respectively. The set of series inductors LO1, LO2, LO3, and LO4, one or more of which may be optional, function improve the impedance match between the dual outputs of filter 230 and outputs of filters 232 and 234 and the inputs of the set of LNAs 242, 244, 246, and 248, respectively.

The set of LNAs 242, 244, 246, and 248 are coupled between second terminals of the first set of switching devices SWO1, SWO2, SWO3, and SWO4 and first terminals of the second set of switching devices SWO5, SWO6, SWO7, and SWO8, respectively. The second set of switching devices SWO5, SWO6, SWO7, and SWO8 include respective second terminals coupled together, and to additional processing circuitry further downstream (e.g., mixer with local oscillator (LO), baseband filter, etc.). Similarly, the open/closed states the first and second sets of switching devices SWO1-SWO4 and SWO5-SWO8 are responsive to the band select signal BAND_SEL generated by the controller 250.

In operation, if the DL signals-of-interest are within frequency bands B25 and B66, which may be multiplexed together, the band select signal BAND_SEL controls the switching devices SWI1, SWO1, SWO3, SWO5, and SWO7 to close, and the switching devices SWI2, SWO2, SWO4, SWO6, and SWO8 to open. In this configuration, the at least one antenna 210 is coupled to the inputs of the filters 230 and 232 including the shunt inductor LI1, the B25 output of filter 230 and the output of filter 232 are coupled to the inputs of the LNAs 242 and 246 via the series inductors LO1 and LO3, and the outputs of the LNAs 242 and 246 are coupled to the additional processing circuitry, respectively.

The filter 230 substantially passes through the DL signal within the B25 frequency band to the B25 output, and substantially rejects signals outside of the B25 frequency band in accordance with a first filter frequency response. Similarly, the filter 232 substantially passes through the DL signal within the B66 frequency band, and substantially rejects signals outside of the B66 frequency band in accordance with a second filter frequency response. Thus, the receiver front-end 200 may process the DL signals within the frequency bands B25 and B66 (e.g., filter and low noise amplify) and provide them to the additional processing circuitry to obtain data embedded in these signals. In this configuration, the B34 filter frequency response of filter 230 is not used as switching device SWO2 coupled to the B34 output of the filter 230 is open, and consequently, LNA 244 is not in operation (e.g., it has no input signal, and not coupled to the additional processing circuitry as switching device SWO6 is open). Also, the remaining filter 234 and LNA 248 are not used because the corresponding switching devices SWI2, SWO4, and SWO8 are open.

Similarly, if the DL signal-of-interest is within frequency band B34, the band select signal BAND_SEL controls the switching devices SWI1, SWO2, and SWO6 to close, and the switching devices SWI2, SWO1, SWO3, SWO4, SWO5, SWO7, and SWO8 to open. In this configuration, the at least one antenna 210 is coupled to the input of the filter 230 including the shunt inductor LI1, the B34 output of the filter 230 is coupled to the input of the LNA 244 via the series inductor LO2, and the output of the LNA 244 is coupled to the additional processing circuitry. The filter 230 substantially passes through the DL signal within the B34 frequency band to the B34 output, and substantially rejects signals outside of the B34 frequency band in accordance with a particular filter frequency response. Thus, the receiver front-end 200 may process the DL signal within the frequency band B34 (e.g., filter and low noise amplify) and provide them to the additional processing circuitry to obtain the data embedded in the signal. In this configuration, the B25 filter frequency response of filter 230 is not used as switching devices SWO1 coupled to the B25 output of the filter 230 is open; and consequently, LNA 242 is not in operational (e.g., it has no input signal, and not coupled to the additional processing circuitry as switching device SWO5 is open). Also, the remaining filters 232 and 236 and LNAs 246 and 248 are not used because the corresponding switching devices SWI2, SWO3, SWO4, SWO7, and SWO8 are open.

Similarly, if the DL signals-of-interest are within frequency bands B34 and B39 in a carrier aggregation (CA) mode of operation, the band select signal BAND_SEL controls the switching devices SWI1, SWI2, SWO2, SWO4, SWO6, and SWO8 to close, and the switching devices SWO1, SWO3, SWO5, and SWO7 to open. In this configuration, the at least one antenna 210 is coupled to the inputs of the filters 230, 232, and 234 including the shunt inductors LI1 and LI2, the B34 output of filter 230 and the output of filter 234 are coupled to the inputs of the LNAs 244 and 248 via the series inductors LO2 and LO4, and the outputs of the LNAs 244 and 248 coupled to the additional processing circuitry.

The filter 230 substantially passes through the DL signal within the B34 frequency band to the B34 output, and substantially rejects signals outside of the B34 frequency band in accordance with a second filter frequency response. Also, the filter 234 substantially passes through the DL signal within the B39 frequency band, and substantially rejects signals outside of the B39 frequency band in accordance with another filter frequency response. Thus, the receiver front-end 200 may process the DL signals within the frequency bands B34 and B39 (e.g., filter and low noise amplify) in CA mode, and provide them to the additional processing circuitry to obtain the data embedded in the signals. In this configuration, the B25 filter frequency response of filter 230 is not used as switching device SWO1 is open; and therefore, the LNA 242 is not in operational (e.g., it has no input signal, and not coupled to the additional processing circuitry as switching device SWO5 is open). Also, the remaining filter 232 and LNA 246 are not used because the corresponding switching devices SWO3 and SWO7 are open.

Comparing the receiver front-end 200 with receiver front-end 100, the receiver front-end 200 includes one less switching device within the antenna switching network 220, one less shunt inductor, and one less filter. This translates to significant cost savings, significant IC footprint savings, and improved receiver performance as there are less components adversely affecting each other.

Figure 2B:
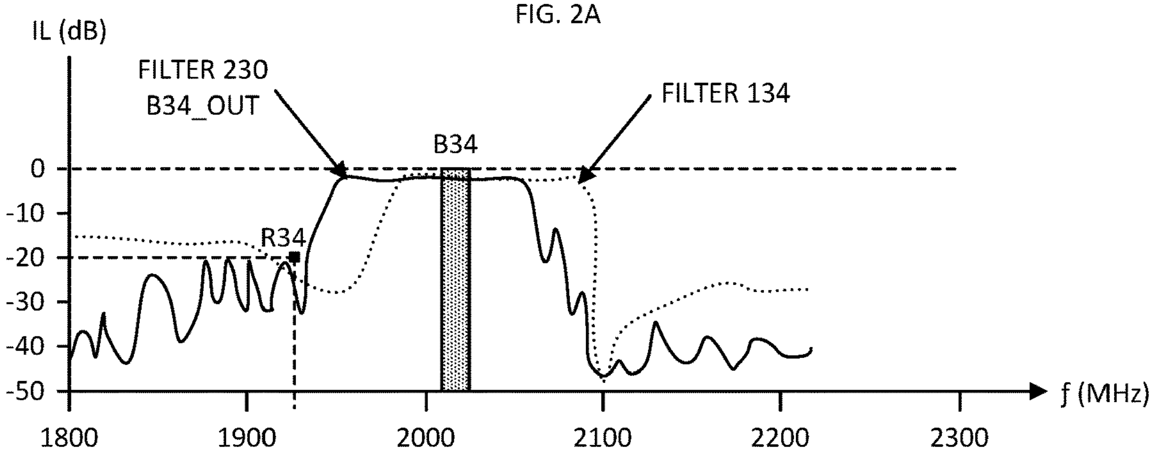
FIG. 2B illustrates a graph of an example first filter frequency response in accordance with another aspect of the disclosure.

FIG. 2B illustrates a graph of an example B34 filter frequency response of the filter 230 in accordance with another aspect of the disclosure. The x- or horizontal axis represents frequency f in MHz. The y- or vertical axis represents insertion loss associated with the frequency response of filter 134 (represented as a dotted line) and the B34 frequency response of the dual-output filter 230 (represented as a solid line). Also superimposed on the graph is a shaded rectangle representing the B34 frequency band, which extends from 2010 to 2025 MHz.

As illustrated, the frequency response of the filter 134 has a passband (e.g., insertion loss of 3 dB or less) that extends from about 1992 to 2094 MHZ, which may be suitable for the B34 frequency band, which extends from 2010 to 2025 MHz. As discussed, the B34 frequency band has a rejection requirement R34 of at least −20 dB at 1925 MHz. Thus, as illustrated, the frequency response of the filter 134 has a rejection of greater than −20 dB at 1925 MHz.

Similarly, the B34 frequency response of the filter 230 has a passband (e.g., insertion loss of 3 dB or less) that extends from about 1956 to 2032 MHz, which may be suitable for B34 frequency band. The B34 frequency response of the filter 230 also meets the R34 rejection requirement of frequency band B34, which includes a notch that has been tuned to provide a rejection greater than −20 dB at 1925 MHZ.

Figure 2C:
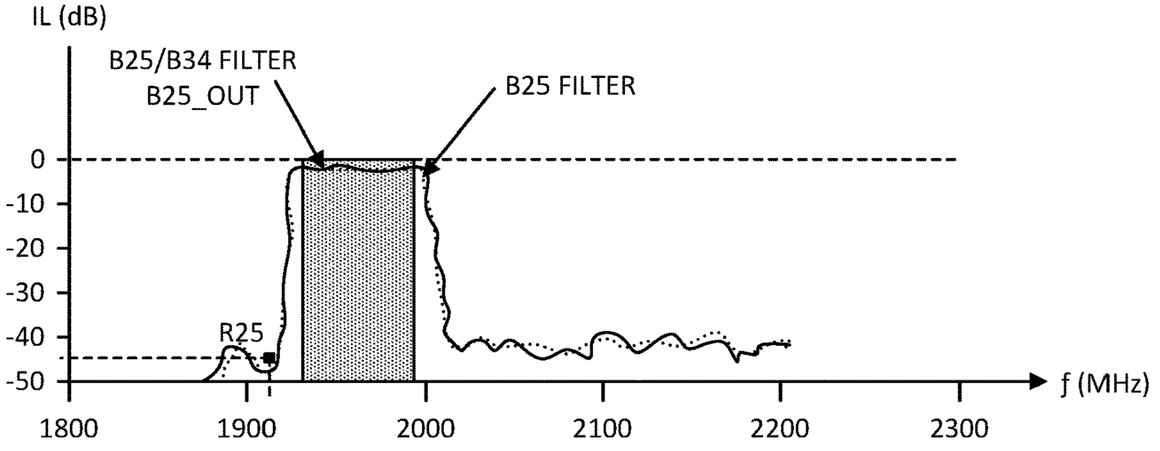
FIG. 2C illustrates a graph of an example second filter frequency response in accordance with another aspect of the disclosure.

FIG. 2C illustrates a graph of an example B25 filter frequency response of the filter 230 in accordance with another aspect of the disclosure. Similarly, the x- or horizontal axis represents frequency f in MHz, and the y- or vertical axis represents insertion loss associated with the frequency response of filter 130 (represented as a dotted line) and the B25 frequency response of the dual-output filter 230 (represented as a solid line). Also superimposed in the graph is a shaded rectangle representing the B25 frequency band, which extends from 1930 to 1995 MHz.

As illustrated, the frequency response of the filter 130 has a passband (e.g., insertion loss of 3 dB or less) that extends from about 1925 to 2000 MHz, which is suitable for the B25 frequency band, which extends from 1930 to 1995 MHz. As discussed, the B25 frequency band as a rejection requirement R25 of −45 dB at 1915 MHz. Thus, as illustrated, the frequency response of the filter 130 has a rejection of greater than −45 dB at 1915 MHZ.

As illustrated, the B25 frequency response of the filter 230 is substantially the same as the frequency response of the filter 130. This is because, as discussed further herein, reconfiguring the filter 130 into the dual-output filter 230 does not significantly affect the frequency response of the filter 130. Thus, the B25 frequency response of the filter 230 also has a passband (e.g., insertion loss of 3 dB or less) that extends from about 1925 to 2000 MHz and rejection of greater than −45 dB at 1915 MHz, which are suitable for the B25 frequency band.

Figure 3:
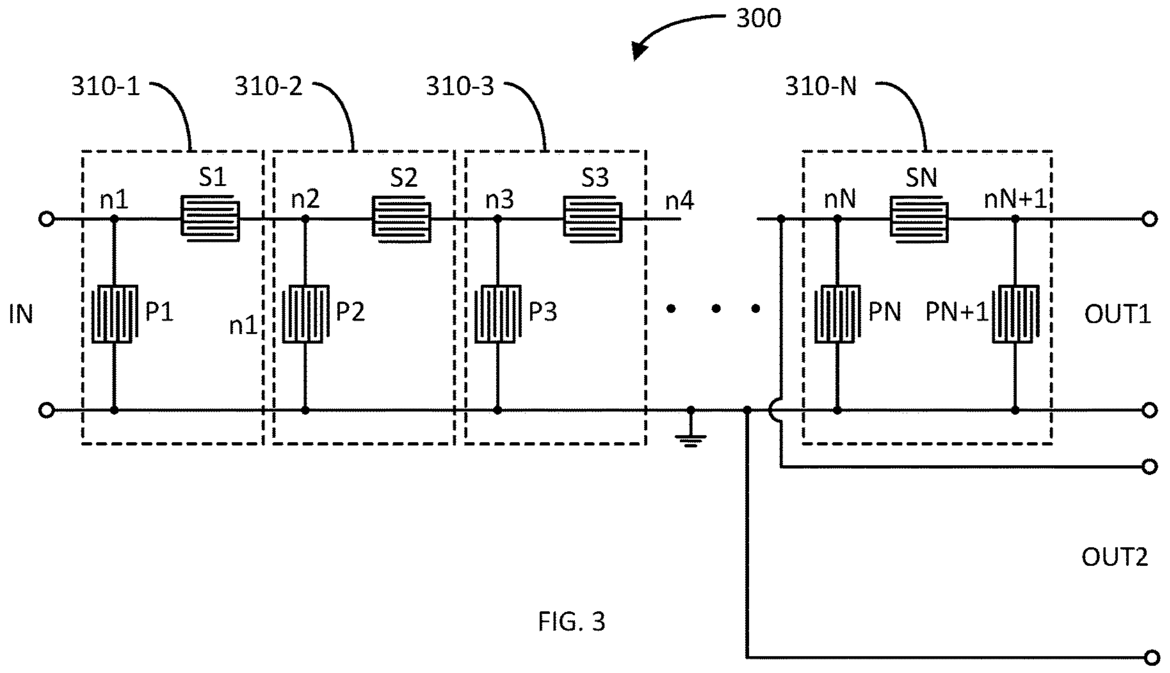
FIG. 3 illustrates a schematic diagram of an example filter with single input, multiple outputs to produce multiple filter frequency responses in accordance with another aspect of the disclosure.

FIG. 3 illustrates a schematic diagram of an example filter 300 with multiple outputs to produce multiple filter frequency responses in accordance with another aspect of the disclosure. The filter 300 may be an example detailed implementation of the filter 230 previously discussed.

The filter 300 includes a filter input (IN), a set of two or more cascaded resonator stages 310-1 to 310-N, a first filter output (OUT1), and a second filter output (OUT2). Another way to characterize the filter 300 is that it includes a first set of one or more cascaded resonator stages (e.g., 310-1 to 310-N−1) between the filter input (IN) and the second filter output (OUT2), and a second set of one or more cascaded resonator stages (e.g., 310-N) between the second filter output (OUT2) and the first filter output (OUT1).

Although, in this example, each of the set of two or more cascaded resonators are described as being a surface acoustic wave (SAW) resonator, it shall be understood that each resonator may be a bulk acoustic wave (BAW) resonator or other type of micro-acoustic resonator. With reference to filter 230 shown in FIG. 2A, the filter input IN is coupled to the shunt inductor LI1 and the second terminal of switching device SWI1. The first filter output OUT1, serves as the B25 output, and is coupled to the series inductor LO1. The second filter output OUT2, serves as the B34 output, and is coupled to the series inductor LO2. The set of two or more cascaded resonator stages is coupled between the filter input IN and the first filter output OUT1.

In this example, each of the cascaded resonator stages includes a parallel resonator (e.g., a micro-acoustic resonator) and a series resonator (e.g., a micro-acoustic resonator), with the exception that the last or Nth resonator stage 310-N may include two parallel resonators. For example, the first resonator stage 310-1 includes a first parallel resonator P1 coupled between a first node n1 and ground, and a first series resonator S1 coupled between the first node n1 and a second node n2. The first node n1 may be the positive terminal of the filter input IN. However, it shall be understood that the filter 300 may include other filter elements preceding the first resonator stage 310-1, such as a double mode SAW (DMS) filter element. The second resonator stage 310-2 includes a second parallel resonator P2 coupled between the second node n2 and ground, and a second series resonator S2 coupled between the second node n2 and a second node n3.

The third resonator stage 310-3 includes a third parallel resonator P3 coupled between the third node n3 and ground, and a third series resonator S3 coupled between the third node n3 and a fourth node n4. Depending on the number of stages N (which as discussed could be two or more), the cascaded resonator stages continues in a similar manner, including, as illustrated the last resonator stage 310-N, which includes an Nth parallel resonator PN coupled between an nN node and ground, an Nth series resonator SN coupled between the nN node and an nN+1 node, and an N+1 parallel resonator coupled between the nN+1 node and ground. The node nN+1 may be the positive terminal of the first filter input output OUT1. However, it shall be understood that the filter 300 may include other filter elements following the resonator stage 310-N, such as a DMS filter element. The filter 300 may also include such DMS filter element between any two of the cascaded resonator stages 310-1 and 310-N.

As discussed, the filter 300 includes the second filter output OUT2 taken across one of an output of the first one or an intermediate one of the cascaded resonator stages (e.g., 310-1 to 310-N−1) and ground. In this example, the second filter output OUT2 is taken across the output of the cascaded resonator stage 310-N−1 (immediately preceding the last cascaded resonator stage 310-N) and ground. However, it shall be understood that the second filter output OUT2 may be taken across any other cascaded resonator stage output (e.g., anyone of node n2 to node nN−1) and ground. As depicted, the second filter output OUT2 bypasses the last cascaded resonator stage 310-N. As discussed, the node nN may be the positive terminal of the second filter input output OUT2. However, it shall be understood that the filter 300 may include other filter elements between the output of the resonator stage 310-N−1 and the second filter output OUT2, such as a DMS filter element.

The filter 300 has a first filter frequency response for a first signal applied to the filter input IN that propagates to the first filter output OUT1 via the set of cascaded resonator stages 310-1 to 310-N. The filter 300 has a second filter frequency response for a second signal applied to the filter input IN and propagates to the second filter output OUT2 via the subset of cascaded resonator stages 310-1 to 310-N−1, although both filter frequency responses are affected by one or more common cascaded resonator stages (e.g., by stages 310-1 to 310-N−1). With reference to filter 230 shown in FIG. 2A, the filter 300 may be configured to apply the first filter frequency response to the first signal that meets the passband and rejection requirements of the B25 frequency band, and apply the second filter frequency response to the second signal that meets the passband and rejection requirements of the B34 frequency band.

As discussed, in this example, each of the cascaded resonator stages includes at least one parallel resonator and a series resonator. It shall be understood that each of the cascaded resonator stages may include a series resonator, but not a parallel resonator (e.g., in the case of a one-port SAW resonator). Also, it shall be understood that each of the cascaded resonator stages need not be configured the same, but one or more may be configured differently, such as the case where the last stage 310-N includes two parallel resonators and the other stages include one parallel resonator. Each of the resonators of the filter 300 may be a SAW type resonator, a BAW type, or other type of resonator, such as a inductor-capacitor resonator, coaxial resonator, dielectric resonator, crystal resonator, ceramic resonator, Yttrium iron garnet (YIG) resonator, or other.

Figure 4:
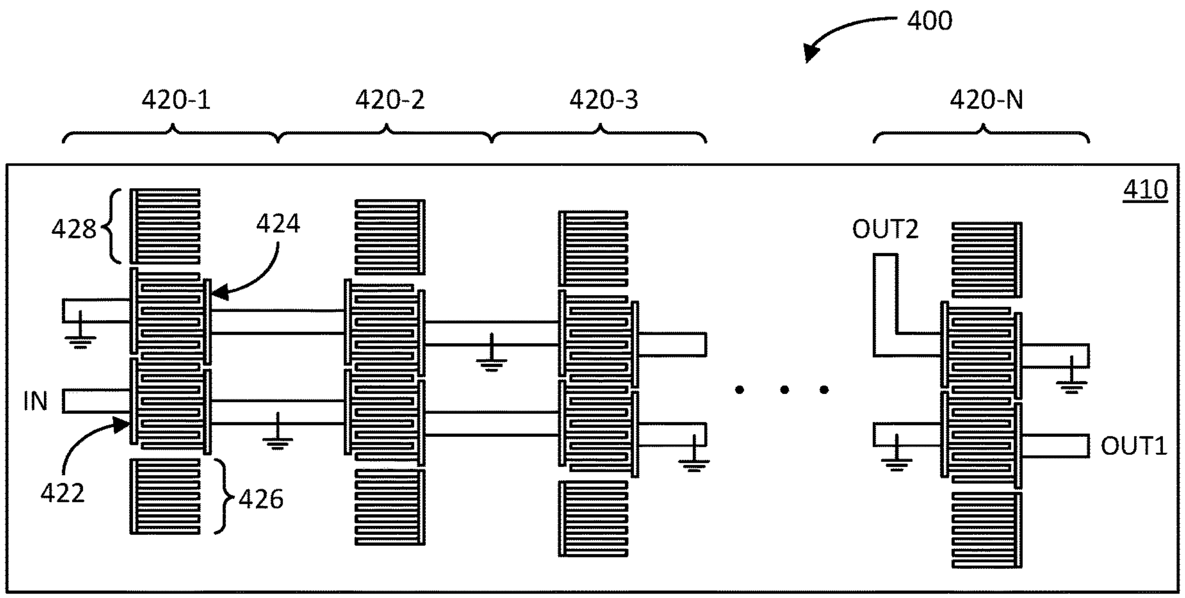
FIG. 4 illustrates a top view of another example filter with single input, multiple outputs to produce multiple filter frequency responses in accordance with another aspect of the disclosure.

FIG. 4 illustrates a top view diagram of an example filter 400 with multiple outputs to produce multiple filter frequency responses in accordance with another aspect of the disclosure. The filter 400 may be an example SAW implementation of the filter 300 previously discussed.

The filter 400 includes a filter input (IN), a set of two or more cascaded resonator stages 420-1 to 420-N, a first filter output (OUT1), and a second filter output (OUT2). The set of cascaded resonators 420-1 to 420-N are coupled between the filter input In and the first filter output OUT1. The set of two or more cascaded resonator stages 420-1 to 420-N are formed on a piezoelectric substrate 410, such as a single crystal quartz, lithium niobite, lithium tantalite, and others. In this example, each of the cascaded resonator stages 420-1 to 420-N is configured as a two-port SAW resonator. That is, each resonator stage includes an input inter digital transducer (IDT) 422 (which is a comb-like electrode or metallization structure disposed on the substrate 410), and output IDT 424, an input grating 426 (e.g., reflector), and an output grating 428 (e.g., reflector).

The input IDT 422 includes a grounded terminal and an input terminal, which may serve as the input IN of the filter 400 if it is part of the first resonator stage 420-1, or a signal from a previous stage if it is part of another resonator stage (e.g., anyone of resonator stages 420-2 to 420-N). The output IDT 424 includes a grounded terminal and an output terminal, which may serve as the first output OUT1 of the filter 400 if it is part of the last resonator stage 420-N, or an output of another resonator stage (e.g., anyone of resonator stages 420-1 to 420-N−1). The input and output IDTs 422 and 424 are juxtaposed next to each other along the interior center of the resonator. The input grating 426 is on the exterior side of the input IDT 422, and the output grating 428 is on the exterior side of the output IDT 424. To form the cascaded arrangement, the output IDT 424 of a preceding resonator stage is coupled to the input IDT 422 of following resonator stage (in other words, the electrode or metallization forming the input and output terminals may be common).

In this example, the first filter output OUT1 of the filter 400 is at the output of the last resonator stage 420-N. The second filter output OUT2 of the filter 400 is at the output of the stage 420-N−1 immediately preceding the last resonator stage 420-N (or the input of the last resonator stage 420-N). However, it shall be understood that the second filter output OUT2 may be at the output of a resonator stage preceding the resonator stage 420-N−1. As in filter 300, there may be other filter elements preceding the filter input IN of filter 400, following the first or second filter outputs OUT1 and OUT2 of the filter 400, or in between two of the cascaded resonator stages, wherein such filter element may include a DMS.

The filter 400 applies a first filter frequency response to a first signal applied to the filter input IN that propagates to the first filter output OUT1 via the set of cascaded resonator stages 420-1 to 420-N. The filter 400 applies a second filter frequency response to a second signal applied to the filter input IN that propagates to the second filter output OUT2 via a subset of the cascaded resonator stages e.g., 420-1 to 420-N−1, although both filter frequency responses are affected by one or more common cascaded resonator stages. With reference to filter 230 shown in FIG. 2A, the filter 400 may be configured to produce the first filter frequency response that meets the passband and rejection requirements of the B25 frequency band, and produce the second filter frequency response that meets the passband and rejection requirements of the B34 frequency band. Although the frequency bands B25 and B34 are used as examples, it shall be understood that the filters described herein are applicable to passbands that are similarly close in frequency or have similar relationship/properties as bands B25 and B34.

Figure 5:
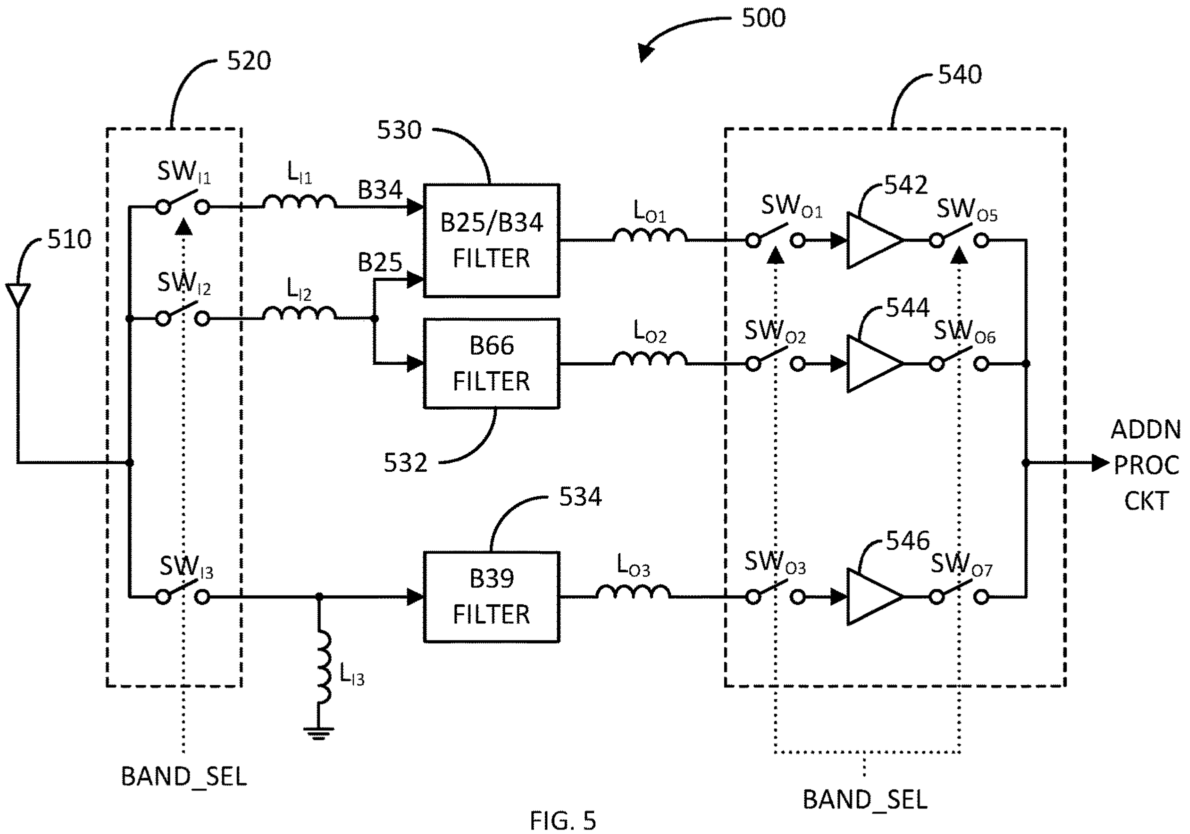
FIG. 5 illustrates a schematic/block diagram of another example receiver front-end in accordance with another aspect of the disclosure.

FIG. 5 illustrates a schematic/block diagram of another example receiver front-end 500 in accordance with another aspect of the disclosure. The receiver front-end 500 includes at least one antenna 510, an antenna switching network 520, a set of inductors LI1, LI2, and LI3, a set of band select filters 530, 532, and 534, a set of series inductors LO1, LO2, and LO3, and a low noise amplifier (LNA) switching network 540. As discussed further herein, the band select filter 530 is configured with multiple- or dual-inputs to produce different frequency responses suitable for different frequency bands, such as the B25 and B34 frequency bands, respectively.

The antenna switching network 520 includes a set of switching devices SWI1, SWI2, and SW13 including respective first terminals coupled to the at least one antenna 510. The open/closed states of the set of switching devices SWI1, SWI2, and SWI3 are responsive to a band select signal BAND_SEL. The series inductor LI1 is coupled between a second terminal of the switching device SWI1 and the B34 input of filter 530. The series inductor LI2 is coupled between the second terminal of the switching device SWI2 and the B25 input of filter 530 and the input of filter 532. The series inductors LI1 and LI2 function to improve the impedance match between the inputs of the filters 530 and 532 and the at least one antenna 510. The shunt inductor LI3 is coupled between a second terminal of the switching device SWI3 (and the input of filter 534) and ground. The shunt inductor LI3 functions to improve the impedance match between the input of the filter 534 and the at least one antenna 510, as well as to provide phase shifting to reduce loading of filter 530 by filter 534 or vice-versa, when the filters 530 and 534 are used simultaneously (i.e., when the inputs of the filters 530 and 534 are coupled together).

The set of filters 530, 532, and 534 are configured to substantially pass through the DL signals within corresponding frequency bands, and substantially reject signals that are outside of the corresponding frequency bands. As previously discussed, the filter 530 includes dual-inputs to provide two different filter frequency responses suitable for frequency bands B25 and B34, respectively; the filter 532 provides a filter frequency response suitable for frequency band B66; and the filter 534 provides a filter frequency response suitable for frequency band B39. Each of the filters 530, 532, and 534 may be configured as a SAW filter.

The LNA switching network 540 includes a first set of switching devices SWO1, SWO2, and SWO3, a set of LNAs 542, 544, and 546, and a second set of switching devices SWO5, SWO6, and SWO7. The set of series inductors LO1, LO2, and LO3 are coupled between the outputs of filters 530, 532 and 534 and first terminals of the first set of switching devices SWO1, SWO2, and SWO3, respectively. The set of series inductors LO1, LO2, and LO3 function to improve the impedance match between the outputs of filters 530, 532 and 534 and the inputs of the set of LNAs 542, 544, and 546, respectively.

The set of LNAs 542, 544, and 548 are coupled between second terminals of the first set of switching devices SWO1, SWO2, and SWO3 and first terminals of the second set of switching devices SWO5, SWO6, and SWO7, respectively. The second set of switching devices SWO5, SWO6, and SWO7 include respective second terminals coupled together, and to additional processing circuitry further downstream (e.g., mixer with local oscillator (LO), baseband filter, etc.). Similarly, the open/closed states the first and second sets of switching devices SWO1-SWO3 and SWO5-SWO7 are responsive to the band select signal BAND_SEL.

In operation, if the DL signal-of-interest is within frequency band B34, the band select signal BAND_SEL controls the switching devices SWI1, SWO1, and SWO5 to close, and the switching devices SWI2, SWI3, SWO2, SWO3, SWO6, and SWO7 to open. In this configuration, the at least one antenna 510 is coupled to the B34 input of the filter 530 via the series inductor LI1, the output of the filter 530 is coupled to the input of the LNA 542 via the series inductor LO1, and the output of the LNA 542 is coupled to the additional processing circuitry. The filter 530 substantially passes through the DL signal within the B34 frequency band, and substantially rejects signals outside of the B34 frequency band in accordance with a particular filter frequency response. Thus, the receiver front-end 500 may process the DL signal within the frequency band B34 (e.g., filter and low noise amplify) and provide it to the additional processing circuitry to obtain the data embedded in the signal. Also, in this configuration, the B25 input to filter 530 is not used as switching devices SWI2 is open. Further, the remaining filters 532 and 534 and LNAs 544 and 546 are not used because the corresponding switching devices SWI2, SWI3, SWO2, SWO3, SWO6, and SWO7 are open.

If the DL signals-of-interest are within frequency bands B25 and B66, which may be multiplexed together, the band select signal BAND_SEL controls the switching devices SWI2, SWO1, SWO2, SWO5, and SWO6 to close, and the switching devices SWI1, SWI3, SWO3, and SWO7 to open. In this configuration, the at least one antenna 510 is coupled to the B25 input of the filter 530 and the input of filter 532, both via the series inductor LI2, the output of filter 530 is coupled to the input of the LNA 542 via the series inductor LO1, the output of filter 532 is coupled to the input of the LNAs 544 via the series inductor LO2, and the outputs of the LNAs 542 and 544 are coupled to the additional processing circuitry.

The filter 530 substantially passes through the DL signal within the B25 frequency band, and substantially rejects signals outside of the B25 frequency band in accordance with a particular filter frequency response. Similarly, the filter 532 substantially passes through the DL signal within the B66 frequency band, and substantially rejects signals outside of the B66 frequency band in accordance with another particular filter frequency response. Thus, the receiver front-end 500 may process the DL signals within the frequency bands B25 and B66 (e.g., filter and low noise amplify) and provide them to the additional processing circuitry to obtain the data embedded in these signals. In this configuration, the B34 input to the filter 530 is not used as switching device SWI1 is open. Also, the remaining filter 534 and LNA 546 are not used because the corresponding switching devices SWI3, SWO3, and SWO7 are open.

Similarly, if the DL signals-of-interest are within frequency bands B34 and B39 in a carrier aggregation (CA) mode of operation, the band select signal BAND_SEL controls the switching devices SWI1, SW13, SWO1, SWO3, SWO5, and SWO7 to close, and the switching devices SWI2, SWO2, and SWO6 to open. In this configuration, the at least one antenna 510 is coupled to the B34 input of the filters 530 via the series inductor LI1, and the input of filter 534, the outputs of filters 530 and 534 are coupled to the inputs of the LNAs 542 and 546 via the series inductors LO1 and LO3, and the outputs of the LNAs 542 and 546 are coupled to the additional processing circuitry.

The filter 530 substantially passes through the DL signal within the B34 frequency band, and substantially rejects signals outside of the B34 frequency band in accordance with a particular filter frequency response. Also, the filter 534 substantially passes through the DL signal within the B39 frequency band, and substantially rejects signals outside of the B39 frequency band in accordance with another particular filter frequency response. Thus, the receiver front-end 500 may process the DL signals within the frequency bands B34 and B39 (e.g., filter and low noise amplify) in CA mode, and provide them to the additional processing circuitry to obtain the data embedded in these signals. In this configuration, the B25 input of the filter 530 is not used as switching device SWI2 is open. Also, the remaining filter 532 and LNA 544 are not used because the corresponding switching devices SWI2, SWO2 and SWO6 are open.

Comparing the receiver front-end 500 with receiver front-end 100, the receiver front-end 500 has less filters, less switching devices, and less LNAs. This translates to significant cost savings, significant IC footprint savings, and improved receiver performance as there are less components to adversely interact with each other.

Figure 6:
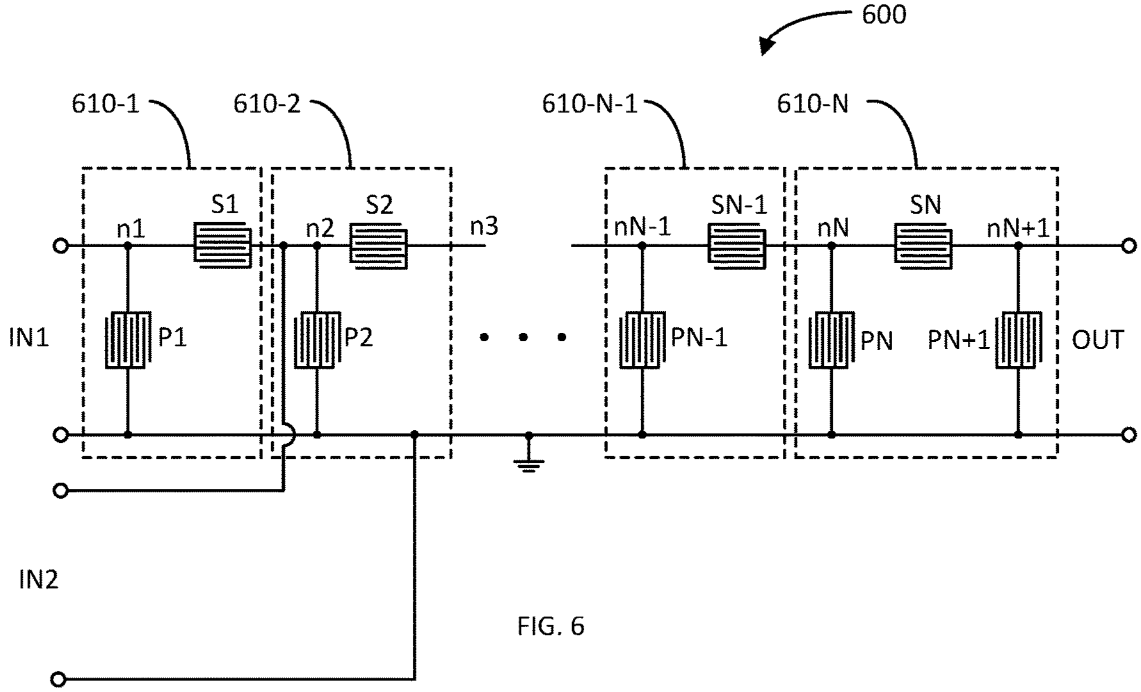
FIG. 6 illustrates a schematic diagram of an example filter with multiple inputs, single output to produce multiple filter frequency responses in accordance with another aspect of the disclosure.

FIG. 6 illustrates a schematic diagram of an example filter 600 with multiple inputs to produce multiple filter frequency responses in accordance with another aspect of the disclosure. The filter 600 may be an example detailed implementation of the filter 530 previously discussed.

The filter 600 includes a first filter input (IN1), a second filter input (IN2), a set of two or more cascaded resonator stages 610-1 to 610-N, and an output (OUT). The set of two or more cascaded resonator stages 610-1 to 610-N is coupled between the first filter input IN and the filter output OUT. Another way to characterize the filter 600 is that it includes a first set of one or more cascaded resonator stages (e.g., 610-1) between the first filter input (IN1) and the second filter input (IN2), and a second set of one or more cascaded resonator stages (e.g., 610-2 to 610-N) between the second filter input (IN2) and the filter output (OUT).

With reference to filter 530 shown in FIG. 5, the first filter input IN1, which may serve as the B25 input, is coupled to the series inductor LI2. The second filter input IN2, which may serve as the B34 input, is coupled to the series inductor LI1. The filter output OUT is coupled to the series inductor LO1.

In this example, each of the cascaded resonator stages includes a parallel resonator (e.g., a micro-acoustic resonator) and a series resonator (e.g., a micro-acoustic resonator), with the exception that the last or Nth resonator stage 610-N may include two parallel resonators. For example, the first resonator stage 610-1 includes a first parallel resonator P1 coupled between a first node n1 and ground, and a first series resonator S1 coupled between the first node n1 and a second node n2. The first node n1 may be the positive terminal of the first filter input IN1. However, it shall be understood that the filter 600 may include other filter elements preceding the first resonator stage 610-1, such as a DMS filter element. The second resonator stage 610-2 includes a second parallel resonator P2 coupled between the second node n2 and ground, and a second series resonator S2 coupled between the second node n2 and a third node n3.

Depending on the number of stages N (which, as discussed, could be two or more), the cascaded resonator stages continues in a similar manner, including, as illustrated the second-to-last resonator stage 610-N−1, which includes a parallel resonator PN−1 coupled between a node nN−1 and ground, and a series resonator SN−1 coupled between the node nN−1 to node nN; and the last resonator stage 610-N, which includes an Nth parallel resonator PN coupled between the nN node and ground, an Nth series resonator SN coupled between the nN node and an nN+1 node, and an N+1 parallel resonator coupled between the nN+1 node and ground. The node nN+1 may serve as the positive terminal of the filter output OUT. However, it shall be understood that the filter 600 may include other filter elements following the resonator stage 610-N, such as a DMS filter element. The filter 600 may also include such DMS filter element between any two of the cascaded resonator stages 610-1 and 610-N.

As discussed, the filter 600 includes the second filter input IN2 coupled to the input (node n2) of the second cascaded resonator stage 610-2 and ground. Thus, the second filter input IN2 bypasses the first cascaded resonator stage 610-1. However, it shall be understood that the second filter input IN2 may be coupled to the input of another cascaded resonator stage, such as anyone of stages 610-3 to 610-N and ground. As discussed, the node n2 may serve as the positive terminal of the second filter input IN2. However, it shall be understood that the filter 600 may include other filter elements between the second filter input IN2 and the input n2 of the second cascaded resonator stage 610-2, such as a DMS filter element.

The filter 600 has a first filter frequency response for a first signal applied to the first filter input IN1 that propagates to the filter output OUT via the set of cascaded resonator stages 610-1 to 610-N. The filter 600 has a second filter frequency response for a second signal applied to the second filter input IN2 and propagates to the filter output OUT via the subset of cascaded resonator stages 610-2 to 610-N, although both filter frequency responses are affected by one or more common cascaded resonator stages. With reference to filter 530 shown in FIG. 5, the filter 600 may be configured to produce the first filter frequency response that meets the passband and rejection requirements of the B25 frequency band, and produce the second filter frequency response that meets the passband and rejection requirements of the B34 frequency band.

As discussed, in this example, each of the cascaded resonator stages includes at least one parallel resonator and a series resonator. It shall be understood that each of the cascaded resonator stages may include a series resonator, but not a parallel resonator (e.g., in the case of a one-port SAW resonator). Also, it shall be understood that each of the cascaded resonator stages need not be configured the same, but one or more may be configured differently, such as the case where the last stage 610-N includes two parallel resonators and the other stages include one parallel resonator. Each of the resonators of the filter 600 may be a SAW or BAW type resonator, or other type of resonator, such as a inductor-capacitor resonator, coaxial resonator, dielectric resonator, crystal resonator, ceramic resonator, Yttrium iron garnet (YIG) resonator, or other.

Figure 7:
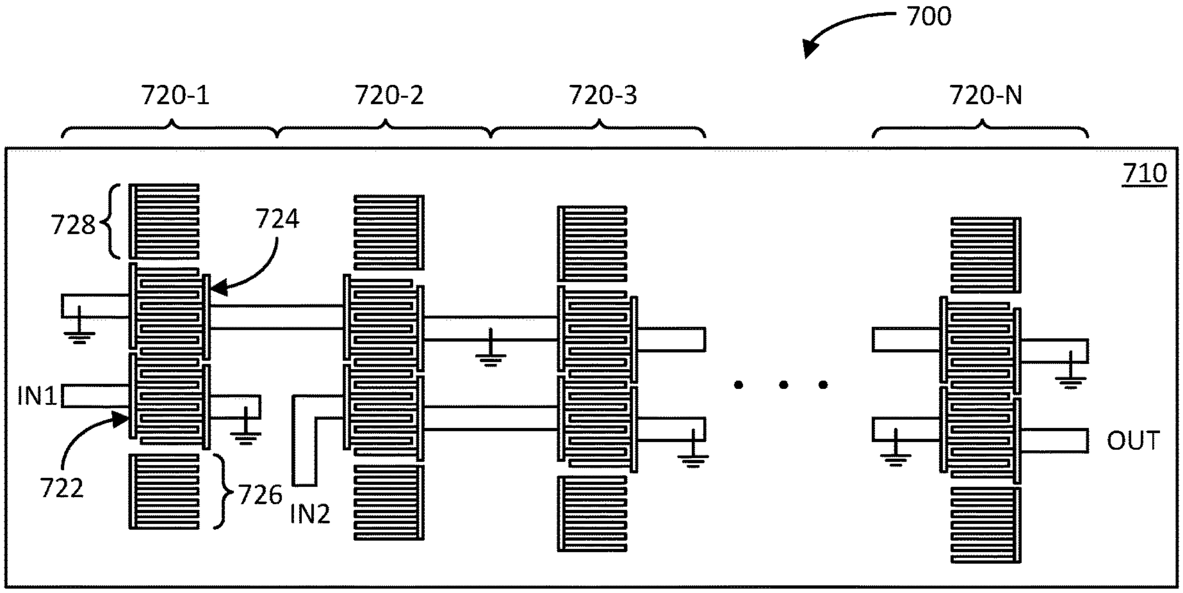
FIG. 7 illustrates a top view of another example filter with multiple inputs, single output to produce multiple filter frequency responses in accordance with another aspect of the disclosure.

FIG. 7 illustrates a top view diagram of an example filter 700 with multiple inputs to produce multiple filter frequency responses in accordance with another aspect of the disclosure. The filter 700 may be an example SAW implementation of the filter 600 previously discussed.

The filter 700 includes a first filter input (IN1), a second filter input (IN2), a set of two or more cascaded resonator stages 720-1 to 720-N, and an output OUT. The set of cascaded resonator stages 720-1 to 720-N are coupled between the first filter input (IN1) and the output OUT. The set of two or more cascaded resonator stages 720-1 to 720-N are formed on a piezoelectric substrate 710, such as single crystal quartz, lithium niobite, lithium tantalite, and others. In this example, each of the cascaded resonator stages 720-1 to 720-N is configured as a two-port SAW resonator. That is, each resonator stage includes an input IDT 722 (which is a comb-like electrode or metallization structure disposed on the substrate 710), and output IDT 724, an input grating 726, and an output grating 728.

The input IDT 722 includes a grounded terminal and an input terminal, which may serve as the first input (IN1) of the filter 700 if it is part of the first resonator stage 720-1, or coupled to an output of a previous stage if it is part of another resonator stage (e.g., anyone of resonator stages 720-2 to 720-N). The output IDT 724 includes a grounded terminal and an output terminal, which may serve as the output (OUT) of the filter 700 if it is part of the last resonator stage 720-N, or produces a signal for a following stage if it is part of another resonator stage (e.g., anyone of resonator stages 720-1 to 720-N−1). The input and output IDTs 722 and 724 are juxtaposed next to each other along the interior center of the resonator. The input grating 726 is on the exterior side of the input IDT 722, and the output grating 728 is on the exterior side of the output IDT 724. To form the cascaded arrangement, the output IDT 724 of a preceding resonator is coupled to the input IDT 722 of following resonator (in other words, the electrode or metallization forming the input and output terminals may be common).

In this example, the first filter input IN1 of the filter 700 is at the input of the first resonator stage 720-1. The second filter input IN2 of the filter 700 is at an input of the second resonator stage 720-2. In this example, the terminal reserved for grounding the output IDT 724 of the second resonator stage 720-2 may be used for the second filter input IN2. However, it shall be understood that the second filter input IN2 may be coupled to the input of a resonator stage following the second resonator stage 720-2. As in filter 300, there may be other filter elements preceding the first and second filter inputs IN1 and IN2 of filter 700, following the output OUT of the filter 700, or in between two cascaded resonator stages, such filter element may include a DMS.

The filter 700 has a first filter frequency response for a first signal applied to the first filter input IN1 that propagates to the filter output OUT via the set of cascaded resonator stages 720-1 to 720-N. The filter 700 has a second filter frequency response for a second signal applied to the second filter input IN2 that propagates to the filter output OUT via the subset of cascaded resonator stages 720-2 to 720-N, although both filter frequency responses are affected by one or more common cascaded resonator stages. With reference to filter 530 shown in FIG. 5, the filter 700 may be configured to produce the first filter frequency response that meets the passband and rejection requirements of the B25 frequency band, and produce the second filter frequency response that meets the passband and rejection requirements of the B34 frequency band.

Figure 8:
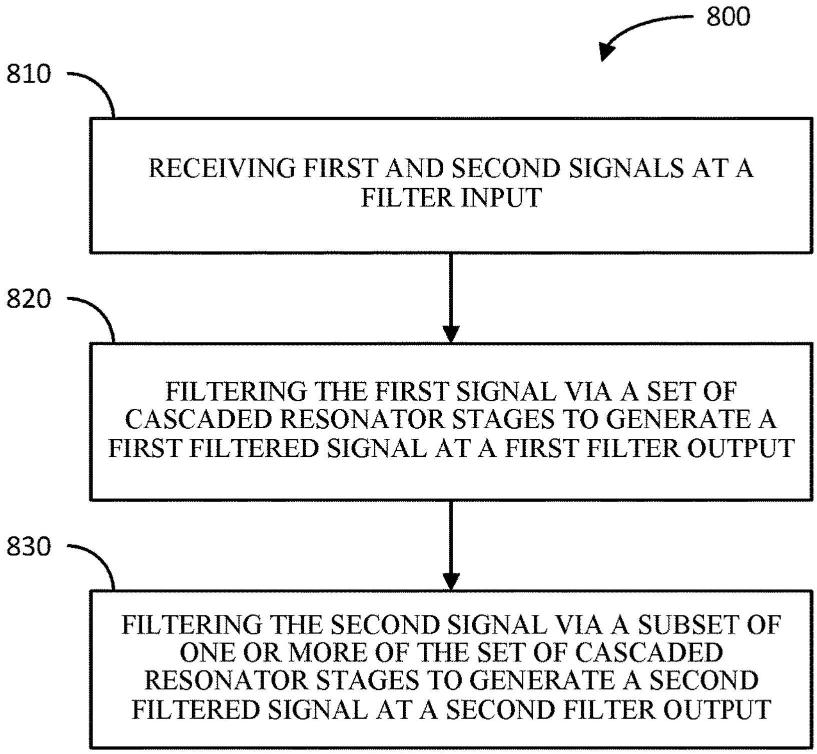
FIG. 8 illustrates a flow diagram of an example method of filtering multiple signals in accordance with another aspect of the disclosure.

FIG. 8 illustrates a flow diagram of an example method 800 of filtering multiple signals in accordance with another aspect of the disclosure. The method 800 includes receiving first and second signals at a filter input (block 810). The method 800 further includes filtering the first signal via a set of cascaded resonator stages to generate a first filtered signal at a first filter output (block 820). Additionally, the method 800 includes filtering the second signal via a subset of one or more of the set of cascaded resonator stages to generate a second filtered signal at a second filter output (block 830).

Figure 9:
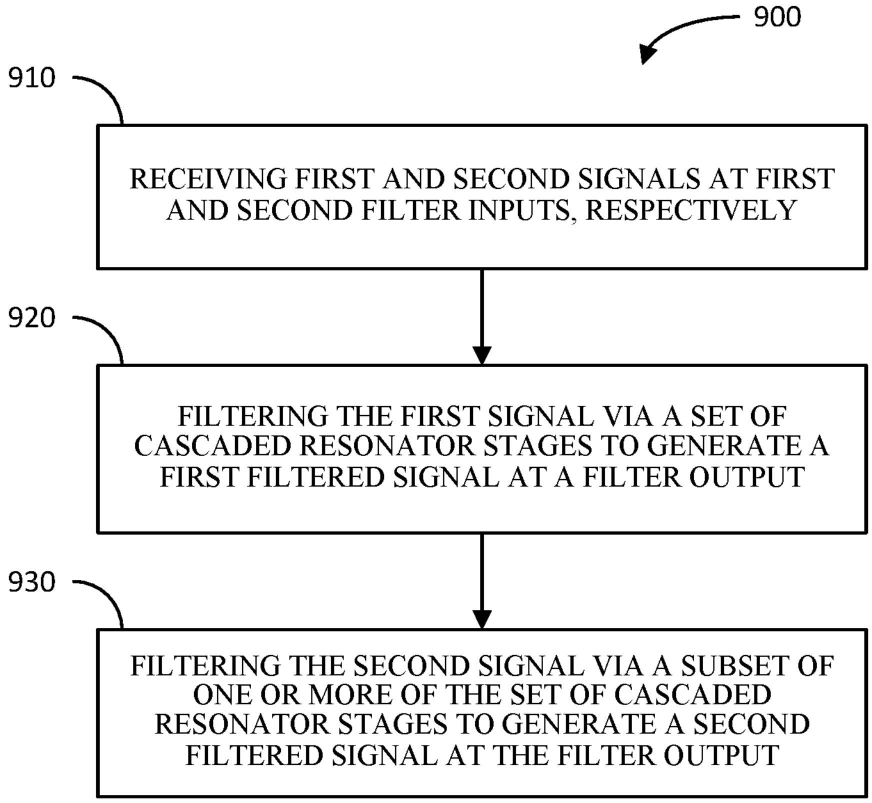
FIG. 9 illustrates a flow diagram of another example method of filtering multiple signals in accordance with another aspect of the disclosure.

FIG. 9 illustrates a flow diagram of another example method 900 of filtering multiple signals in accordance with another aspect of the disclosure. The method 900 includes receiving first and second signals at first and second filter inputs, respectively (block 910). The method 900 further includes filtering the first signal via a set of cascaded resonator stages to generate a first filtered signal at a filter output (block 920). Additionally, the method 900 includes filtering the second signal via a subset of one or more of the set of cascaded resonator stages to generate a second filtered signal at the filter output (block 930).

Figure 10:
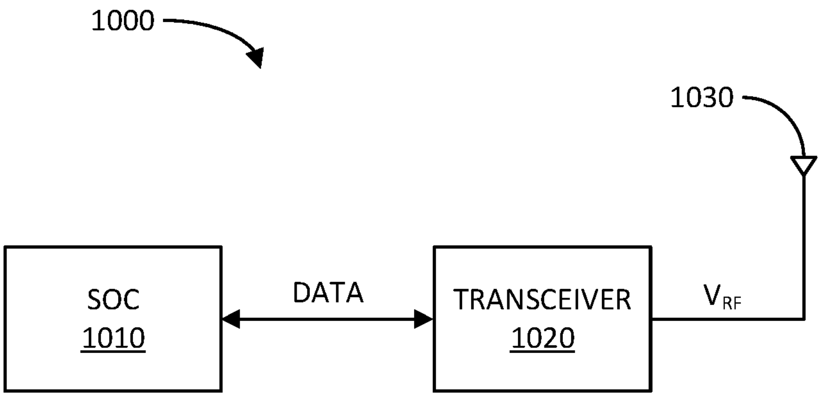
FIG. 10 illustrates a block diagram of an example wireless communication device in accordance with another aspect of the disclosure.

FIG. 10 illustrates a block diagram of an example wireless communication device 1000 in accordance with another aspect of the disclosure. The wireless communication device 1000 may take the form of a smart phone, personal computer, laptop computer, computing pad, Internet of Things (IoT) devices, vehicle traffic control devices, sensors, and others. In this example, the wireless communication device 1000 is configured to at least wirelessly receive a signal from a remote device, such as a base station.

The wireless communication device 1000 includes a baseband integrated circuit (IC) 1010, which may be configured as a system on chip (SOC). The SOC 1010 may be configured to process data in accordance with any number of applications. The wireless communication device 1000 further includes a transceiver 1020 and at least one antenna 1030. The transceiver 1020 may include any of the receiver front-ends described herein. The at least one antenna 1030 may correspond to any of the at least one antenna described herein.

The at least one antenna 1030 wirelessly receives a radio frequency (RF) signal within one or more frequency bands from a remote device, such as a base station. As discussed, the receiver front-end in the transceiver 1020 selects the appropriate dual-input or dual-output filter and LNA to filter and amplify the received RF signal. The transceiver 1020 may process the filtered and amplified RF signal to generate a baseband signal, and process the baseband signal to generate data. The data may be provided to the SOC 1010 for processing in accordance with any number of applications.

Although the wireless communication device 1000 is described as receiving signals, it shall be understood that the wireless communication device 1000 (such as the transceiver 1020) may be configured to also generate and transmit RF signals to one or more other devices, such as a base station.

Implementation examples are in the following numbered clauses:

1. An apparatus, comprising a filter including:
   - a first set of one or more cascaded resonator stages coupled between a filter input and a first filter output, each cascaded resonator stage of the first set comprising a first series micro-acoustic resonator and a first parallel micro-acoustic resonator; and
   - a second set of one or more cascaded resonator stages coupled between the first filter output and a second filter output, each cascaded resonator stage of the second set comprising a second series micro-acoustic resonator and a second parallel micro-acoustic resonator.

2. The apparatus of clause 1, wherein at least one of the first or second series micro-acoustic resonator, or first or second parallel micro-acoustic resonator includes a one-port surface acoustic wave (SAW) resonator.

3. The apparatus of clause 1 or 2, wherein at least one of the first or second series micro-acoustic resonator, or first or second parallel micro-acoustic resonator includes a two-port surface acoustic wave (SAW) resonator.

4. The apparatus of any of clauses 1-3, wherein the filter further comprises a double mode surface acoustic wave (DMS) filter element.

5. The apparatus of any of clauses 1-4, wherein at least one of the first or second series micro-acoustic resonator, or first or second parallel micro-acoustic resonator includes a bulk acoustic wave (BAW) resonator.

6. The apparatus of any of clauses 1-5, wherein the filter is configured to:
   - apply a first filter frequency response to a first signal propagating from the filter input to the first filter output via the first set of one or more cascaded resonator stages; and
   - apply a second filter frequency response to a second signal propagating from the filter input to the second filter output via the first and second sets of cascaded resonator stages.

7. The apparatus of clause 6, wherein the second filter frequency response includes a passband that extends from 1930 megaHertz (MHz) to 1995 MHz.

8. The apparatus of clause 6, wherein the first filter frequency response includes a passband that extends from 2010 MHz to 2025 MHz.

9. The apparatus of any of clauses 1-8, further comprising at least one antenna coupled to the filter input.

10. The apparatus of clause 9, wherein the at least one antenna is coupled to the filter input via a switching device responsive to a band select signal.

11. The apparatus of any of clauses 1-10, further comprising a shunt inductor coupled between the filter input and ground.

12. The apparatus of any of clauses 1-11, further comprising:
    - a first low noise amplifier (LNA);
    - a first series inductor coupled between the first filter output of the filter and an input of the first LNA;
    - a second LNA; and
    - a second series inductor coupled between the second filter output and an input of the second LNA.

13. The apparatus of clause 12, further comprising:
    - a first switching device coupled in series with the first series inductor between the first filter output of the filter and the input of the first LNA; and
    - a second switching device coupled in series with the second series inductor between the second filter output of the filter and the input of the second LNA, wherein the first and second switching devices are responsive to a band select signal.

14. The apparatus of clause 13, further comprising:
    - additional processing circuitry;
    - a third switching device coupled between an output of the first LNA and the additional processing circuitry; and
    - a fourth switching device coupled between an output of the second LNA and the additional processing circuitry, wherein the first and second switching devices are responsive to a band select signal.

15. The apparatus of clause 14, further comprising:
    - a second filter;
    - a third LNA;
    - a third series inductor coupled between an output of the second filter and an input of the third LNA;

a fifth switching device coupled in series with the third series inductor between the output of the second filter and the input of the third LNA; and a sixth switching device coupled between an output of the third LNA and the additional processing circuitry.

16. The apparatus of clause 15, wherein an input of the second filter is coupled to the filter input of the filter.

17. A method, comprising:

receiving first and second signals at a filter input;

filtering the first signal via a set of cascaded resonator stages to generate a first filtered signal at a first filter output; and filtering the second signal via a subset of one or more of the set of cascaded resonator stages to generate a second filtered signal at a second filter output.

18. The method of clause 17, wherein:

the set of cascaded resonator stages apply a first filter frequency response to the first signal to generate the first filtered signal; and the subset of one or more of the set of cascaded resonator stages apply a second filter frequency response to the second signal to generate the second filtered signal, wherein the first filter frequency response is different than the second filter frequency response.

19. The method of clause 17 or 18, wherein at least one of the set of cascaded resonator stages includes a one-port surface acoustic wave (SAW) resonator.

20. The method of any of clauses 17-19, wherein at least one of the set of cascaded resonator stages includes a two-port surface acoustic wave (SAW) resonator.

21. The method of any of clauses 17-20, wherein at least one of the set of cascaded resonator stages includes a micro-acoustic resonator.

22. An apparatus, comprising a filter including:

a first set of one or more cascaded resonator stages coupled between a first filter input and a second filter input, each cascaded resonator stage of the first set comprising a first series micro-acoustic resonator and a first parallel micro-acoustic resonator; and a second set of one or more cascaded resonator stages coupled between the second filter input and a filter output, each cascaded resonator stage of the second set comprising a second series micro-acoustic resonator and a second parallel micro-acoustic resonator.

23. The apparatus of clause 22, wherein at least one of the first or second series micro-acoustic resonator, or first or second parallel micro-acoustic resonator includes a one-port surface acoustic wave (SAW) resonator.

24. The apparatus of clause 22 or 23, wherein at least one of the first or second series micro-acoustic resonator, or first or second parallel micro-acoustic resonator includes a two-port surface acoustic wave (SAW) resonator.

25. The apparatus of any of clauses 22-24, wherein at least one of the first or second series micro-acoustic resonator, or first or second parallel micro-acoustic resonator includes a bulk acoustic wave (BAW) resonator.

26. The apparatus of any of clauses 22-25, wherein the filter is configured to:

apply a first filter frequency response to a first signal propagating from the first filter input to the filter output via the first and second sets of cascaded resonator stages; and apply a second filter frequency response to a second signal propagating from the second filter input to the filter output via the second set of one or more cascaded resonator stages.

27. The apparatus of clause 26, wherein the first filter frequency response includes a passband that extends from 1930 megaHertz (MHz) to 1995 MHz.

28. The apparatus of clause 26, wherein the second filter frequency response includes a passband that extends from 2010 MHz to 2025 MHz.

29. An apparatus, comprising a filter including a set of cascaded resonator stages coupled between a filter input and a first filter output, wherein the filter includes a second filter output coupled to an output of a first or an intermediate one of the set of cascaded resonator stages.

30. The apparatus of clause 29, wherein at least one of the set of cascaded resonator stages includes a parallel resonator and a series resonator.

31. A method, comprising:

receiving first and second signals at first and second filter inputs, respectively;

filtering the first signal via a set of cascaded resonator stages to generate a first filtered signal at a filter output; and filtering the second signal via a subset of one or more of the set of cascaded resonator stages to generate a second filtered signal at the filter output.

32. The method of clause 29, wherein at least one of the set of cascaded resonator stages includes a micro-acoustic resonator.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:

a first low noise amplifier (LNA);

a second low noise amplifier (LNA);

a first filter comprising a first input, a first output, a second output, and a plurality of micro-acoustic resonators, the first filter coupled between an antenna and the first and second LNAs, the plurality of micro-acoustic resonators coupled between the first input to the first filter and the first output of the first filter, a sub-set of one or more of the plurality of micro-acoustic resonators coupled between the first input to the first filter and the second output of the first filter, the second output bypassing a portion of less than all of the plurality of micro-acoustic resonators, wherein the first filter is configured to:

apply a first bandpass filter frequency response to a first signal propagating from the first input to the first filter to the first output of the first filter; and apply a second bandpass filter frequency response to a second signal propagating from the first input to the first filter to the second output of the first filter;

a first switch coupled between the first output of the first filter and the first LNA; and a second switch coupled between the second output of the first filter and the second LNA.

2. The apparatus of claim 1, wherein the first bandpass filter frequency response is configured for a first communication band and the second bandpass filter frequency response is configured for a second communication band different from the first communication band.

3. The apparatus of claim 1, further comprising a controller configured to: apply one or more control signals configured to close the first switch and open the second switch based on a first operating mode associated with a first communication band; and apply the one or more control signals to open the first switch and close the second switch based on a second operating mode associated with a second communication band, wherein the first bandpass filter frequency response is configured for the first communication band and the second bandpass filter frequency response is configured for the second communication band.

4. The apparatus of claim 1, wherein the plurality of micro-acoustic resonators comprise one or more series resonators and one or more parallel resonators, the sub-set of the one or more of the plurality of micro-acoustic resonators including at least a portion of the one or more series resonators and at least a portion of the one or more parallel resonators.

5. The apparatus of claim 1, further comprising:
- a third switch coupled between the antenna and the first input to the first filter;
- a second filter;
- a third low noise amplifier (LNA);
- a fourth switch coupled between the antenna and the second filter; and
- a fifth switch coupled between the second filter and the third LNA.

6. The apparatus of claim 5, further comprising a controller configured to apply one or more control signals configured to close the second, third, fourth, and fifth switches and open the first switch based on a first operating mode associated with a carrier aggregation mode; and apply the one or more control signals to close the second and third switches and open the first, fourth, and fifth switches based on a second operating mode.

7. The apparatus of claim 1, further comprising:
- a second filter including a second input and a third output, wherein the second input is coupled to the first input to the first filter;
- a third low noise amplifier (LNA); and
- a third switch coupled between the third output of the second filter and the third LNA.

8. The apparatus of claim 1, further comprising:
- a third low noise amplifier (LNA);
- a third switch; and
- a second filter including a second input and a third output, wherein the third switch is coupled between the third output of the second filter and the third LNA, wherein the second filter is configured to apply a third bandpass filter frequency response to a third signal propagating from the second input to the third output of the second filter.

9. The apparatus of claim 8, wherein:
- the first bandpass filter frequency response is configured for a first communication band and the second bandpass filter frequency response is configured for a second communication band different from the first communication band;
- the third bandpass filter frequency response is configured for a third communication band different from the first communication band and the second communication band; and
- the first bandpass filter frequency response includes a notch to achieve a specified rejection associated with the third communication band.

10. The apparatus of claim 8, wherein:
- the first bandpass filter frequency response is configured for a first communication band and the second bandpass filter frequency response is configured for a second communication band different from the first communication band;
- the third bandpass filter frequency response is configured for a third communication band different from the first communication band and the second communication band; and
- the second bandpass filter frequency response includes a notch to achieve a specified rejection associated with the third communication band.

11. The apparatus of claim 1, wherein at least one of the plurality of micro-acoustic resonators includes a surface acoustic wave (SAW) resonator or a bulk acoustic wave (BAW) resonator.

12. An apparatus, comprising:
- a first low noise amplifier (LNA);
- a first filter comprising a first filter input, a second filter input, a filter output, and a plurality of micro-acoustic resonators, the first filter coupled between an antenna and the first LNA, the plurality of micro-acoustic resonators coupled between the first filter input to the first filter and the filter output of the first filter, a sub-set of one or more of the plurality of micro-acoustic resonators coupled between the second filter input to the first filter and the filter output of the first filter, the second filter input to the first filter bypassing a portion of less than all of the plurality of micro-acoustic resonators, wherein the first filter is configured to:
  - apply a first filter frequency response to a first signal propagating from the first filter input to the filter output; and
  - apply a second filter frequency response to a second signal propagating from the second filter input to the filter output;
- a first switch coupled between the antenna and the first filter input; and
- a second switch coupled between the antenna and the second filter input.

13. The apparatus of claim 12, wherein the first filter frequency response is configured for a first communication band and the second filter frequency response is configured for a second communication band different from the first communication band.

14. The apparatus of claim 12, further comprising a controller configured to: apply one or more control signals configured to close the first switch and open the second switch based on a first operating mode associated with a first communication band; and apply the one or more control signals to open the first switch and close the second switch based on a second operating mode associated with a second communication band, wherein the first filter frequency response is configured for the first communication band and the second filter frequency response is configured for the second communication band.

15. The apparatus of claim 12, wherein the plurality of micro-acoustic resonators comprise one or more series resonators and one or more parallel resonators, the sub-set of the one or more of the plurality of micro-acoustic resonators including at least a portion of the one or more series resonators and at least a portion of the one or more parallel resonators.

16. The apparatus of claim 12, further comprising:
- a second low noise amplifier (LNA);
- a second filter coupled between the antenna and the second LNA; and a third switch coupled between the antenna and a third filter input to the second filter.

17. The apparatus of claim 16, further comprising a controller configured to apply one or more control signals configured to close the second and third switches and open the first switch based on a first operating mode associated with a carrier aggregation mode; and apply the one or more control signals to close the second switch and open the first and third switches based on a second operating mode.

18. The apparatus of claim 12, further comprising:

a second low noise amplifier (LNA); and a second filter coupled between the antenna and the second LNA, wherein the second filter includes a third filter input coupled to the first filter input of the first filter.

19. The apparatus of claim 12, wherein at least one of the plurality of micro-acoustic resonators includes a surface acoustic wave (SAW) or bulk acoustic wave (BAW) resonator.

20. An apparatus, comprising:

at least one low noise amplifier (LNA); and a filter comprising a first input port, a second input port, an output port, and a plurality of micro-acoustic resonators, the filter coupled between an antenna and the at least one LNA, the plurality of micro-acoustic resonators coupled between the first input port and the output port of the filter, a sub-set of one or more of the plurality of micro-acoustic resonators coupled between the output port and the second input port of the filter, the second input port bypassing a portion of less than all of the plurality of micro-acoustic resonators, wherein the filter is configured to:

apply a first filter frequency response to a first signal propagating from the first input port to the output port of the filter; and apply a second filter frequency response to a second signal propagating from the first input port to the second input port of the filter or from the second input port to the output port of the filter.

* * * * *